(12) United States Patent
Vermeulen et al.

(10) Patent No.: US 8,368,868 B2
(45) Date of Patent: Feb. 5, 2013

(54) LITHOGRAPHIC APPARATUS WITH GAS PRESSURE MEANS FOR CONTROLLING A PLANAR POSITION OF A PATTERNING DEVICE CONTACTLESS

(75) Inventors: Johannes Petrus Martinus Bernardus Vermeulen, Helmond (NL); Marcel Koenraad Marie Baggen, Nuenen (NL); Hans Butler, Best (NL); Henrikus Herman Marie Cox, Eindhoven (NL); Jan Van Eijk, Eindhoven (NL); Andre Bernardus Jeunink, Bergeijk (NL); Nicolaas Rudolf Kemper, Eindhoven (NL); Robert-Han Munnig Schmidt, Hapert (NL); Engelbertus Antonius Fransiscus Van Der Pasch, Oirschot (NL); Marc Wilhelmus Maria Van Der Wijst, Veldhoven (NL); Theodorus Petrus Maria Cadee, Vlierden (NL); Fransiscus Mathijs Jacobs, Asten (NL); Christiaan Louis Valentin, 's-Gravenzande (NL)

(73) Assignee: ASML Netherlands B.V., Veldhoven (NL)

( * ) Notice: Subject to any disclaimer, the term of this patent is extended or adjusted under 35 U.S.C. 154(b) by 561 days.

(21) Appl. No.: 12/627,087

(22) Filed: Nov. 30, 2009

(65) Prior Publication Data

US 2010/0159399 A1    Jun. 24, 2010

Related U.S. Application Data

(60) Provisional application No. 61/139,460, filed on Dec. 19, 2008.

(51) Int. Cl.
*G03B 27/42* (2006.01)
(52) U.S. Cl. ............... 355/53; 355/72; 355/73; 355/91; 355/92
(58) Field of Classification Search ............... 355/53, 355/72, 73, 1, 949; 318/653; 269/21
See application file for complete search history.

(56) References Cited

U.S. PATENT DOCUMENTS
6,094,255 A    7/2000    Ota

*Primary Examiner* — Toan Ton
*Assistant Examiner* — Mesfin T Asfaw
(74) *Attorney, Agent, or Firm* — Pillsbury Winthrop Shaw Pittman LLP (57) ABSTRACT

A lithographic apparatus includes a position controller configured to control a position of a patterning device in its planar direction by selectively pressing at least one of the side faces of the patterning device. The position controller includes a gas pressure supply and one or more outflow openings directed towards at least one side face of the patterning device so as to exert pressurized gas on this side face in order to control the position of the patterning device in its planar direction in a contactless manner.

14 Claims, 4 Drawing Sheets

LITHOGRAPHIC APPARATUS WITH GAS PRESSURE MEANS FOR CONTROLLING A PLANAR POSITION OF A PATTERNING DEVICE CONTACTLESS

CROSS REFERENCE TO RELATED APPLICATIONS

This application claims priority and benefit under 35 U.S.C. §119(e) to U.S. Provisional Patent Application No. 61/139,460, entitled "Lithographic Apparatus With Gas Pressure Means For Controlling A Planar Position Of A Patterning Device Contactless", filed on Dec. 19, 2008. The content of that application is incorporated herein in its entirety by reference.

FIELD

The present invention relates to a lithographic apparatus and a method for manufacturing a device.

BACKGROUND

A lithographic apparatus is a machine that applies a desired pattern onto a substrate, usually onto a target portion of the substrate. A lithographic apparatus can be used, for example, in the manufacture of integrated circuits (ICs). In such a case, a patterning device, which is alternatively referred to as a mask or a reticle, may be used to generate a circuit pattern to be formed on an individual layer of the IC. This pattern can be transferred onto a target portion (e.g. including part of, one, or several dies) on a substrate (e.g. a silicon wafer). Transfer of the pattern is typically via imaging onto a layer of radiation-sensitive material (resist) provided on the substrate. In general, a single substrate will contain a network of adjacent target portions that are successively patterned. Conventional lithographic apparatus include so-called steppers, in which each target portion is irradiated by exposing an entire pattern onto the target portion at once, and so-called scanners, in which each target portion is irradiated by scanning the pattern through a radiation beam in a given direction (the "scanning"-direction) while synchronously scanning the substrate parallel or anti-parallel to this direction. It is also possible to transfer the pattern from the patterning device to the substrate by imprinting the pattern onto the substrate.

It is known to clamp the patterning device onto a support during a lithographic process. With this the support includes a clamping mechanism. For example the patterning device may be clamped with membranes in order to constrain X, Y and Rz positions of the patterning device, that is to say in order to constrain its planar movements. In addition, on the lower side of the patterning device three support points may be provided in combination with an air cushion in order to determine the Rx, Ry and Z position. In this way, the patterning device will only deform by the stiffness ratio between the membranes and the patterning device which is about 500 ppm.

However, due to the friction-based clamping of the patterning device, in combination with finite stiffness in the clamping mechanism, micro-slip and hysteresis occur in the position of the patterning device. The hysteresis depends among others on acceleration of the support during the lithographic process, vacuum forces of the clamping mechanism, contamination of the patterning device, humidity, and choice of material for the patterning device. Part of the hysteresis is macroscopic and reproducible for the up and down motions of the support, that is to say in the Z-direction. A significant portion, however, is microscopic, that is to say within the patterning device, and does not reproduce. This causes internal stress in the patterning device and a significant contribution on overlay, which will increase to tens or even hundreds of nm for this type of clamping mechanism.

U.S. Pat. No. 6,094,255 discloses a variant embodiment in which the patterning device is kept floating at a desired distance above a floating plate of a support. The three support points at the lower side of the patterning device are then dispensed with. Instead, a controller is provided which is designed to adjust the pressure of air blown from air holes below the patterning device in such a way that the patterning device is floated. The position of the patterning device in its x-y plane is controlled in accordance with measurements taken by a position measuring apparatus and is controlled by selectively pressing the respective side faces of the patterning device. For exerting these pressing forces, a large number of control bars is in contact with the side faces of the patterning device. The controller also controls the driving of linear motors having stators and sliders, thereby adjusting the pressing forces of the control bars.

The floating or levitation of the patterning device has the benefit that it does not contact any surface of the support. Deformation of the patterning device on the one hand is thus minimized and on the other hand is somewhat more reproducible in order to be able to minimize overlay errors.

Nevertheless, the construction with the linear motors and control bars is somewhat expensive and, for example, the overlay performances with this type of patterning device support may not be sufficient.

SUMMARY

It is desirable to at least partly eliminate the above mentioned disadvantages or to provide a usable alternative. Embodiments of the invention provide a patterning device support which leads to an improved overlay.

According to an embodiment of the invention, there is provided a lithographic apparatus including an illumination system configured to condition a radiation beam; a support constructed to support a patterning device, the patterning device being capable of imparting the radiation beam with a pattern in its cross-section to form a patterned radiation beam, the patterning device having upper and lower planar surfaces connected to each other by side faces; a substrate table constructed to hold a substrate; a projection system configured to project the patterned radiation beam onto a target portion of the substrate; and a position controller configured to control a position of the patterning device in a direction substantially parallel to the planar surfaces of the patterning device by selectively pressing at least one of the side faces of the patterning device, the position controller including a gas pressure supply and one or more outflow openings directed towards the at least one side face of the patterning device, the gas pressure supply and the one or more outflow openings configured to exert pressurized gas on the at least one side face so as to control the position of the patterning device in the direction substantially parallel to the planar surfaces of the patterning device in a contactless manner.

According to another embodiment of the invention, there is provided a lithographic apparatus including a system arranged to transfer a pattern from a patterning device onto a substrate; a support constructed to support the patterning device, the patterning device having upper and lower planar surfaces connected to each other by side faces; a substrate table constructed to hold the substrate; and a position controller configured to control a position of the patterning device in a direction substantially parallel to the planar surfaces of the patterning device by selectively pressing at least one of the side faces of the patterning device, the position controller including a gas pressure supply and one or more outflow openings directed towards the at least one side face of the patterning device, the gas pressure supply and the one or more outflow openings configured to exert pressurized gas on the at least one side face so as to control the position of the patterning device in the direction substantially parallel to the planar surfaces of the patterning device in a contactless manner.

According to another embodiment of the invention, there is provided a device manufacturing method for projecting a patterned beam of radiation onto a substrate, including supporting a patterning device on a support, the patterning device having upper and lower planar surfaces connected to each other by side faces; imparting a radiation beam using the patterning device to form a patterned radiation beam; projecting the patterned radiation beam onto a target portion of the substrate; and controlling a position of the patterning device in a direction substantially parallel to the planar surfaces, the controlling including selectively pressing against at least one of the side faces of the patterning device by exerting pressurized gas on the at least one side face of the patterning device using one or more outflow openings and a gas pressure supply so as to control the position of the patterning device in the direction substantially parallel to the planar surfaces of the patterning device in a contactless manner.

BRIEF DESCRIPTION OF THE DRAWINGS

Embodiments of the invention will now be described, by way of example only, with reference to the accompanying schematic drawings in which corresponding reference symbols indicate corresponding parts, and in which.

DETAILED DESCRIPTION

Figure 1:
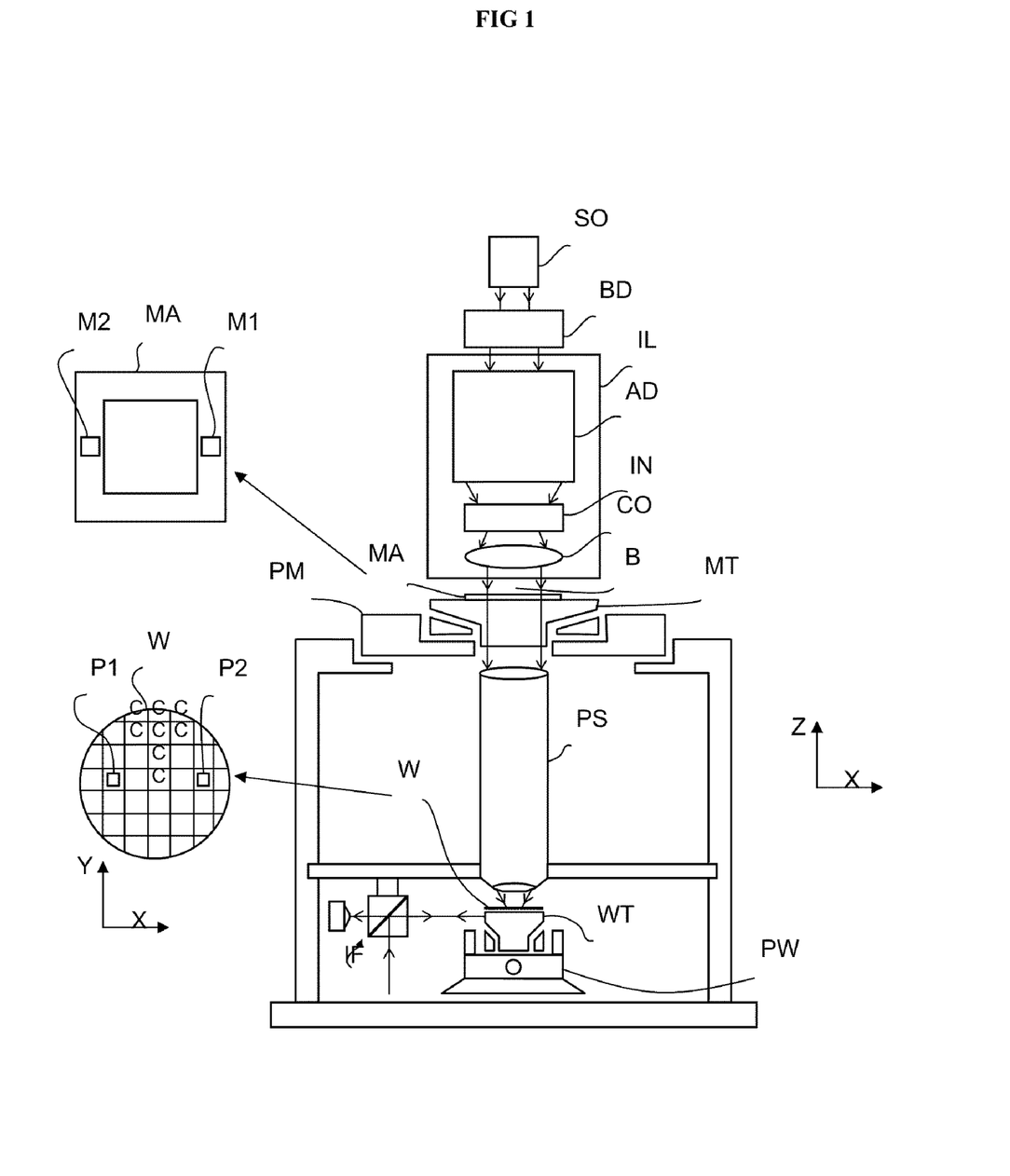
FIG. 1 depicts a lithographic apparatus according to an embodiment of the invention.

FIG. 1 schematically depicts a lithographic apparatus according to one embodiment of the invention. The apparatus includes an illumination system (illuminator) IL configured to condition a radiation beam B (e.g. UV radiation or any other suitable radiation), a mask support structure (e.g. a mask table) MT constructed to support a patterning device (e.g. a mask) MA and connected to a first positioning device PM configured to accurately position the patterning device in accordance with certain parameters. The apparatus also includes a substrate table (e.g. a wafer table) WT or "substrate support" constructed to hold a substrate (e.g. a resist-coated wafer) W and connected to a second positioning device PW configured to accurately position the substrate in accordance with certain parameters. The apparatus further includes a projection system (e.g. a refractive projection lens system) PS configured to project a pattern imparted to the radiation beam B by patterning device MA onto a target portion C (e.g. including one or more dies) of the substrate W.

The illumination system may include various types of optical components, such as refractive, reflective, magnetic, electromagnetic, electrostatic or other types of optical components, or any combination thereof, to direct, shape, or control radiation.

The patterning device support holds the patterning device in a manner that depends on the orientation of the patterning device, the design of the lithographic apparatus, and other conditions, such as for example whether or not the patterning device is held in a vacuum environment. The patterning device support can use mechanical, vacuum, electrostatic or other clamping techniques to hold the patterning device. The patterning device support may be a frame or a table, for example, which may be fixed or movable as required. The patterning device support may ensure that the patterning device is at a desired position, for example with respect to the projection system. Any use of the terms "reticle" or "mask" herein may be considered synonymous with the more general term "patterning device."

The term "patterning device" used herein should be broadly interpreted as referring to any device that can be used to impart a radiation beam with a pattern in its cross-section so as to create a pattern in a target portion of the substrate. It should be noted that the pattern imparted to the radiation beam may not exactly correspond to the desired pattern in the target portion of the substrate, for example if the pattern includes phase-shifting features or so called assist features. Generally, the pattern imparted to the radiation beam will correspond to a particular functional layer in a device being created in the target portion, such as an integrated circuit.

The patterning device may be transmissive or reflective. Examples of patterning devices include masks, programmable mirror arrays, and programmable LCD panels. Masks are well known in lithography, and include mask types such as binary, alternating phase-shift, and attenuated phase-shift, as well as various hybrid mask types. An example of a programmable mirror array employs a matrix arrangement of small mirrors, each of which can be individually tilted so as to reflect an incoming radiation beam in different directions. The tilted mirrors impart a pattern in a radiation beam which is reflected by the mirror matrix.

The term "projection system" used herein should be broadly interpreted as encompassing any type of projection system, including refractive, reflective, catadioptric, magnetic, electromagnetic and electrostatic optical systems, or any combination thereof, as appropriate for the exposure radiation being used, or for other factors such as the use of an immersion liquid or the use of a vacuum. Any use of the term "projection lens" herein may be considered as synonymous with the more general term "projection system".

As here depicted, the apparatus is of a transmissive type (e.g. employing a transmissive mask). Alternatively, the apparatus may be of a reflective type (e.g. employing a programmable mirror array of a type as referred to above, or employing a reflective mask).

The lithographic apparatus may be of a type having two (dual stage) or more substrate tables or "substrate supports"

(and/or two or more mask tables or "mask supports"). In such "multiple stage" machines the additional tables or supports may be used in parallel, or preparatory steps may be carried out on one or more tables or supports while one or more other tables or supports are being used for exposure.

The lithographic apparatus may also be of a type wherein at least a portion of the substrate may be covered by a liquid having a relatively high refractive index, e.g. water, so as to fill a space between the projection system and the substrate. An immersion liquid may also be applied to other spaces in the lithographic apparatus, for example, between the patterning device (e.g. mask) and the projection system Immersion techniques can be used to increase the numerical aperture of projection systems. The term "immersion" as used herein does not mean that a structure, such as a substrate, must be submerged in liquid, but rather only means that a liquid is located between the projection system and the substrate during exposure.

Referring to FIG. 1, the illuminator IL receives a radiation beam from a radiation source SO. The source and the lithographic apparatus may be separate entities, for example when the source is an excimer laser. In such cases, the source is not considered to form part of the lithographic apparatus and the radiation beam is passed from the source SO to the illuminator IL with the aid of a beam delivery system BD including, for example, suitable directing mirrors and/or a beam expander. In other cases the source may be an integral part of the lithographic apparatus, for example when the source is a mercury lamp. The source SO and the illuminator IL, together with the beam delivery system BD if required, may be referred to as a radiation system.

The illuminator IL may include an adjuster AD configured to adjust the angular intensity distribution of the radiation beam. Generally, at least the outer and/or inner radial extent (commonly referred to as σ-outer and σ-inner, respectively) of the intensity distribution in a pupil plane of the illuminator can be adjusted. In addition, the illuminator IL may include various other components, such as an integrator IN and a condenser CO. The illuminator may be used to condition the radiation beam, to have a desired uniformity and intensity distribution in its cross-section.

The radiation beam B is incident on the patterning device (e.g., mask) MA, which is held on the patterning device support (e.g., mask table) MT, and is patterned by the patterning device. Having traversed the patterning device (e.g. mask) MA, the radiation beam B passes through the projection system PS, which focuses the beam onto a target portion C of the substrate W. With the aid of the second positioning device PW and position sensor IF (e.g. an interferometric device, linear encoder or capacitive sensor), the substrate table WT can be moved accurately, e.g. so as to position different target portions C in the path of the radiation beam B. Similarly, the first positioning device PM and another position sensor (which is not explicitly depicted in FIG. 1) can be used to accurately position the patterning device (e.g. mask) MA with respect to the path of the radiation beam B, e.g. after mechanical retrieval from a mask library, or during a scan. In general, movement of the patterning device support (e.g. mask table) MT may be realized with the aid of a long-stroke module (coarse positioning) and a short-stroke module (fine positioning), which form part of the first positioning device PM. Similarly, movement of the substrate table WT or "substrate support" may be realized using a long-stroke module and a short-stroke module, which form part of the second positioner PW. In the case of a stepper (as opposed to a scanner) the patterning device support (e.g. mask table) MT may be connected to a short-stroke actuator only, or may be fixed. Patterning device (e.g. mask) MA and substrate W may be aligned using patterning device alignment marks M1, M2 and substrate alignment marks P1, P2. Although the substrate alignment marks as illustrated occupy dedicated target portions, they may be located in spaces between target portions (these are known as scribe-lane alignment marks). Similarly, in situations in which more than one die is provided on the patterning device (e.g. mask) MA, the patterning device alignment marks may be located between the dies.

The depicted apparatus could be used in at least one of the following modes:

1. In step mode, the patterning device support (e.g. mask table) MT or "mask support" and the substrate table WT or "substrate support" are kept essentially stationary, while an entire pattern imparted to the radiation beam is projected onto a target portion C at one time (i.e. a single static exposure). The substrate table WT or "substrate support" is then shifted in the X and/or Y direction so that a different target portion C can be exposed. In step mode, the maximum size of the exposure field limits the size of the target portion C imaged in a single static exposure.

2. In scan mode, the patterning device support (e.g. mask table) MT or "mask support" and the substrate table WT or "substrate support" are scanned synchronously while a pattern imparted to the radiation beam is projected onto a target portion C (i.e. a single dynamic exposure). The velocity and direction of the substrate table WT or "substrate support" relative to the patterning device support (e.g. mask table) MT or "mask support" may be determined by the (de-)magnification and image reversal characteristics of the projection system PS. In scan mode, the maximum size of the exposure field limits the width (in the non-scanning direction) of the target portion in a single dynamic exposure, whereas the length of the scanning motion determines the height (in the scanning direction) of the target portion.

3. In another mode, the patterning device support (e.g. mask table) MT or "mask support" is kept essentially stationary holding a programmable patterning device, and the substrate table WT or "substrate support" is moved or scanned while a pattern imparted to the radiation beam is projected onto a target portion C. In this mode, generally a pulsed radiation source is employed and the programmable patterning device is updated as required after each movement of the substrate table WT or "substrate support" or in between successive radiation pulses during a scan. This mode of operation can be readily applied to maskless lithography that utilizes programmable patterning device, such as a programmable mirror array of a type as referred to above.

Combinations and/or variations on the above described modes of use or entirely different modes of use may also be employed.

Figure 2:
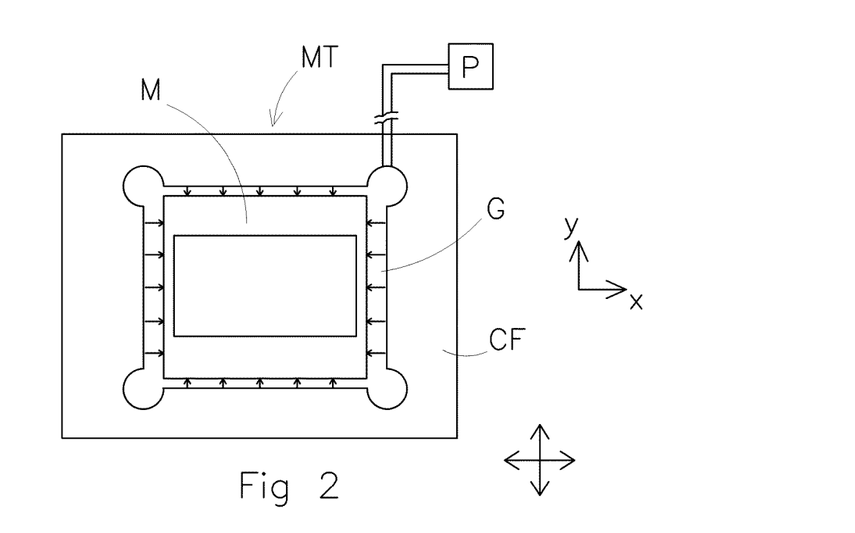
FIG. 2 shows a schematic top view of an embodiment of the patterning device support of FIG. 1 with a clamping frame according to the present invention.

In FIG. 2 an embodiment of the patterning device support MT is shown with a clamping frame CF according to an embodiment of the invention. This clamping frame CF extends around the entire circumference of the patterning device (e.g. mask) M and with this delimits an opening with a substantially similar shape as the patterning device (e.g. mask) M. The opening has inner dimensions which are slightly larger than the outer circumference of the patterning device (e.g. mask) M. Thus a small gap G, preferably of a few micrometers, is left free between the frame CF and the patterning device (e.g. mask) M. A gas pressure supply P is provided which via one or more suitably directed outflow openings in the frame open out into the gap G. These outflow openings for example may be provided at the shown larger corners of the opening in the frame CF, but also may be provided along one or more of the straight sides of the frame CF.

The patterning device (e.g. mask) M can now be held in the frame CF by feeding pressurized gas into the gap G. This pressurized gas automatically spreads itself throughout the entire gap G and exerts normal forces on all side faces of the patterning device (e.g. mask) M. A controlled leakage of gas occurs towards the upper and lower sides of the frame and patterning device (e.g. mask) owing to the small gap which has been left free. The smaller the gap G, the more resistance for the gas to leak out and the higher the built up of gas pressure against the side faces of the patterning device (e.g. mask) M. In this embodiment, the gap G for example may have a width which is at least equal to the tolerance of the side faces of the patterning device (e.g. mask) M, that is to say approximately 200 micrometers. However such a relatively large width may create the leakage of gas too large, and the exerted normal forces too low. If so, it may be desirable to use patterning devices (e.g. masks) with polished side faces in order to lower the tolerances of the side faces and make it possible to use a smaller gap width of preferably less than 20 micrometers. Further in the embodiment shown the patterning device (e.g. mask) M is rectangular and includes two pairs of opposite side faces. Each pair of these side faces extends substantially parallel to either the x- either the y-direction. Since the pressurized gas exerts substantially equal forces on each of the side faces of the patterning device (e.g. mask) M, the patterning device (e.g. mask) M is automatically centered inside the frame CF with a substantially uniform gap width around the circumference. The patterning device (e.g. mask) M is thus constrained in a contactless manner inside the frame CF by these gas pressure forces.

Horizontal motion of the patterning device (e.g. mask) M in its x-y plane can be achieved by moving the frame CF in this x-y plane using a suitable driver, in particular a linear drive rigidly connected to the frame CF. The frame may for example be actuated in the x-y plane using a conventional Lorentz short-stroke motors that are connected to a long-stroke stage. In order to cope with position deviations between the patterning device (e.g. mask) M and the frame CF in the gas film, it is preferred to directly measure the patterning device position instead of the frame position and input these measurements into a suitable control unit of a position controller, which position controller in this case control the driver configured to move the frame and thus indirectly also control the positioning of the patterning device (e.g. mask).

The entire force that is necessary for accelerations and decelerations of the patterning device (e.g. mask) M during a lithographic process is applied through the normal gas pressure forces at the side faces of the patterning device (e.g. mask) M. Thus, an embodiment of the invention provides the benefit that friction no longer plays a role in the planar fixation of the patterning device. The position of the patterning device (e.g. mask) M in its planar x-y direction can now be controlled in a contactless manner. With this contactless planar constraining of the patterning device (e.g. mask) M, a simultaneous enhancement of throughput and overlay performance in the lithographic apparatus is achieved. The patterning device (e.g. mask) M is no longer internally deformed owing to its contactless planar constraining. Non-reproducible hysteresis in the planar position controller is eliminated, enabling significant accelerations during the lithographic process which substantially improves the related throughput. Furthermore, since heavy clamp are no longer needed, and an ultra light short stroke is created, the moving mass of both the short stroke and long stroke positioning systems may be reduced up to a factor of 5 to 10. This makes a step towards a much higher acceleration, up to for example 400 m/s2, possible. The lower weight makes it possible to keep using normal actuators, instead of high-power actuators, to achieve the required acceleration. This in turn has the benefit that extensive cooling and multiple power amplifiers are not necessary for the actuators.

The pressurized gas between the frame CF and the patterning device (e.g. mask) M furthermore has the benefit that it allows frictionless motion of the patterning device (e.g. mask) M in Z, Rx and Ry direction, that is to say in the direction perpendicular to its planar surfaces. As a consequence, the position of the frame CF itself in this Z, Rx and Ry direction are no longer critical.

Other important benefits are that heating of the patterning device leads to a uniform expansion of the patterning device because of the contactless way of holding it. Besides that the fact that gasses are now present around the circumference of the patterning device, results in a beneficial cooling around the patterning device.

It is also possible to use the contactless clamping of the invention for other purposes. For example, it is possible to control an amount of enlargement using pressure modulation, that is to say an all-round pressing together of the patterning device.

Figure 3:
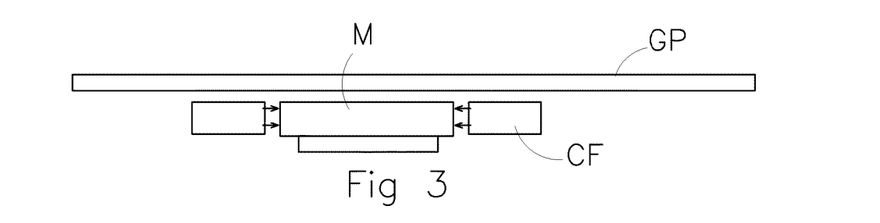
FIG. 3 shows a variant embodiment in side view with the patterning device held floating beneath a glass plate.
Figure 4:
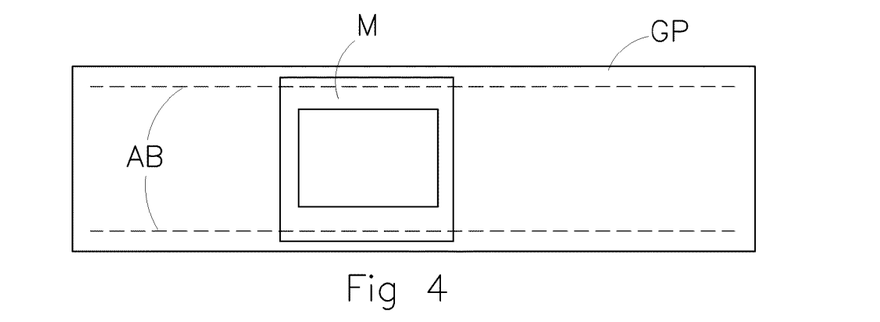
FIG. 4 shows a top view of FIG. 3 without the clamping frame.

The out-of plane positioning of the patterning device can be achieved by using active bearing systems relative to the long stroke stage, such as variable reluctance actuators, or passive bearing systems, such as flexure bearings or gas bearings. Preferably however, the support for the patterning device (e.g. mask) M includes a gas bearing for keeping the patterning device floating relative to a planar surface of the support. The patterning device (e.g. mask) M may be floated underneath or on top of a plate, in particular a glass plate, using high-stiffness gas bearings. FIGS. 3 and 4 show an embodiment in which the patterning device (e.g. mask) M is kept floating under a glass plate GP. The glass plate includes gas bearings AB at respective sides of the mask position. Both the gas supply for the bearings AB and the vacuum for preload are integrated in the glass plate GP.

Motions of the patterning device (e.g. mask) M in the vertical Z-direction can now be achieved by moving the glass plate GP by using suitable actuators. This means that no vertical actuators have to be moved in the planar directions when the patterning device needs to be moved in that planar direction. The glass plate GP can maintain its planar position and is constructed long enough for the patterning device and clamping frame to make their required strokes there below during the lithographic process. This saves mass and cabling and hoses to the short stroke stage. By maintaining a gas film between the patterning device (e.g. mask) M and the glass plate GP a bending of the patterning device (e.g. mask) M can be avoided.

Figure 5:
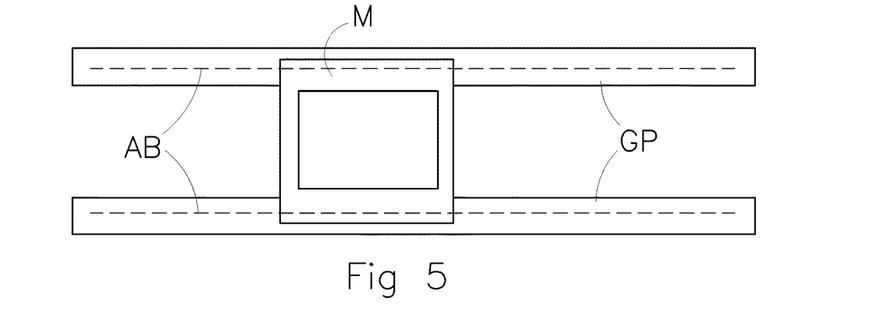
FIG. 5 shows a variant of FIG. 4 with the patterning device held floating beneath two glass plates.

FIG. 5 shows an alternative embodiment with which instead of one glass plate, two smaller plates are used. Here, the patterning device (e.g. mask) M is kept floating on its side regions that owing to the contactless constraining of the patterning device (e.g. mask) M inside the frame CF no longer are to be used for clamping and thus are available for these levitation forces.

The combination of keeping the patterning device (e.g. mask) M floating in the vertical Z-direction and constrained in the planar X-Y directions using a self-adjusting pressurized gas mechanism has the benefit that no contact between the patterning device (e.g. mask) M and parts of the support like the frame CF other than gas are present. The vertical degrees of freedom Z, Rx, Ry are actuated by actuating the glass plate GP, whereas the horizontal degrees of freedom X, Y, Rz are actuated by actuating the frame CF. Thus, an ultra-light and ultra-fast patterning device stage is achieved which is fully based on pressurized bearings.

Figure 6:
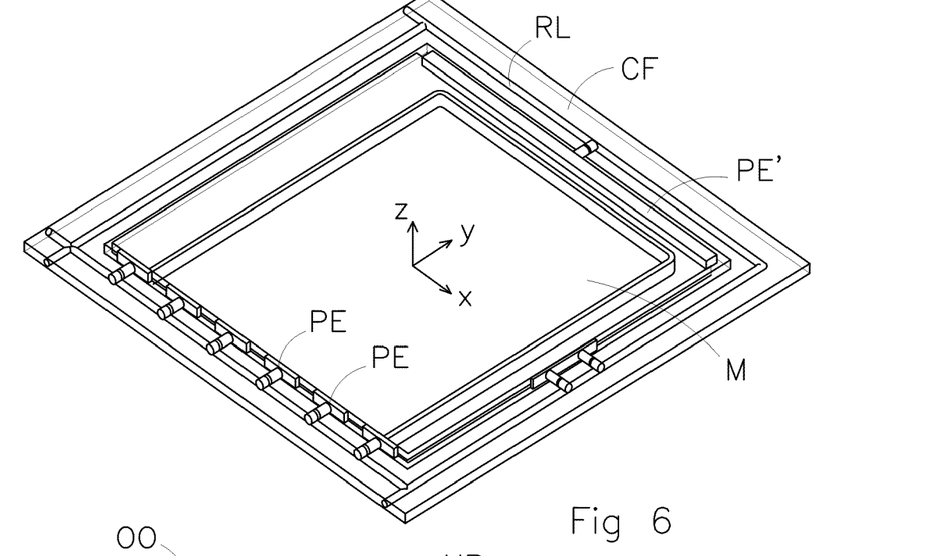
FIG. 6 shows in perspective an embodiment of the clamping frame with flexible positioning elements mounted therein.
Figure 7:
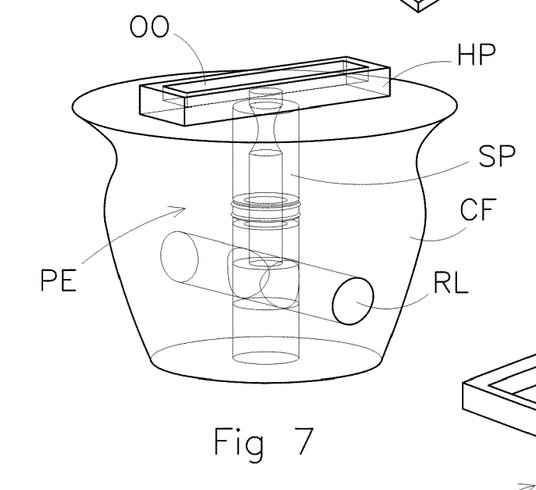
FIG. 7 shows an enlarged partial view of FIG. 6 at the location of one of the positioning elements.

In FIG. 6 an embodiment is shown in which the clamping frame CF again delimits an opening for circumventing a patterning device (e.g. mask) M to be held therein. The opening now however has dimensions such that a plurality of positioning elements PE can be provided in the gap between the frame CF and the patterning device (e.g. mask) M without actually having to touch the patterning device (e.g. mask) M. Each of the positioning elements PE is mounted with a stem part SP in the frame CF and delimits an outflow opening OO at the front side of its head part HP, that is to say at the side facing the respective side face of the patterning device (e.g. mask) M. The outflow opening OO of each positioning element PE is in flow communication with a common ring line RL in the frame CF. The ring line RL is connected to gas pressure supply and thus feeds each positioning element PE with pressurized gas. Between the front side of the positioning element PE and the side faces of the patterning device (e.g. mask) M a gap of a few micrometers is left free.

Each positioning element PE is mounted flexibly relative to the frame CF. In particular it is able to slide somewhat in and out of the frame and possibly even swivel slightly relative to the frame CF. This has the benefit that possible irregularities of the side faces of the patterning device (e.g. mask) M can easily be coped with by corresponding correcting movements of those respective positioning elements at the locations of these irregularities. It is then not necessary to polish the side faces of the patterning device, which saves time and costs. The gap width between the front sides of the positioning elements PE and the patterning device (e.g. mask) M preferably is less than 20 micrometers. When pressurized the positioning elements PE automatically maintain a particular gap width relative to the patterning device (e.g. mask) M because of their ability to slide with their stem parts in and out of the frame CF.

The patterning device (e.g. mask) M can now be held in the frame CF by feeding pressurized gas into the ring line RL. This pressurized gas automatically spreads itself towards each of the outflow openings OO in the various positioning elements PE. The outflow openings OO are directed towards the side faces of the patterning device (e.g. mask) M and via these outflow openings OO normal forces are exerted on all side faces of the patterning device (e.g. mask) M. Again the patterning device (e.g. mask) M is automatically centered inside the frame with a substantially uniform gap width between each of the positioning elements PE and the patterning device (e.g. mask) M around the entire circumference. The patterning device (e.g. mask) M is thus constrained in a contactless manner inside the frame CF by these gas pressure forces. The gas pressure further automatically causes each positioning element PE to take its optimum contactless position relative to the part of the side face of the patterning device (e.g. mask) M it is opposing. This automatic seeking of the optimum position aids in preventing the situation that part of the positioning element PE may accidentally get in touch with the patterning device (e.g. mask) M.

Like with the embodiment of FIGS. 2-5, the horizontal motions of the patterning device (e.g. mask) M in its x-y plane can be achieved by moving the frame CF in this x-y plane using a suitable driver.

In FIG. 6 several embodiments are shown. On the lower side it is shown that a number of positioning elements PE are provided next to each other which together cover substantially the entire respective side face of the mask M. On the right side an embodiment is shown with only two positioning elements PE located at the center of the respective side face of the patterning device (e.g. mask) M. On the upper side, a variant is shown with only one longitudinal positioning element PE' which extends over substantially the entire length of the respective side face of the mask M.

Figure 8:
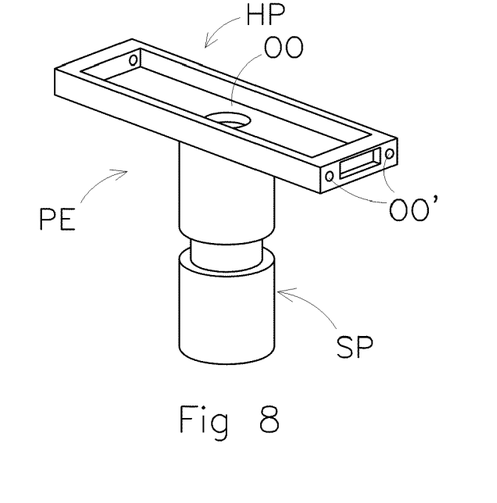
FIG. 8 shows an embodiment of the positioning element of FIG. 7.
Figure 9:
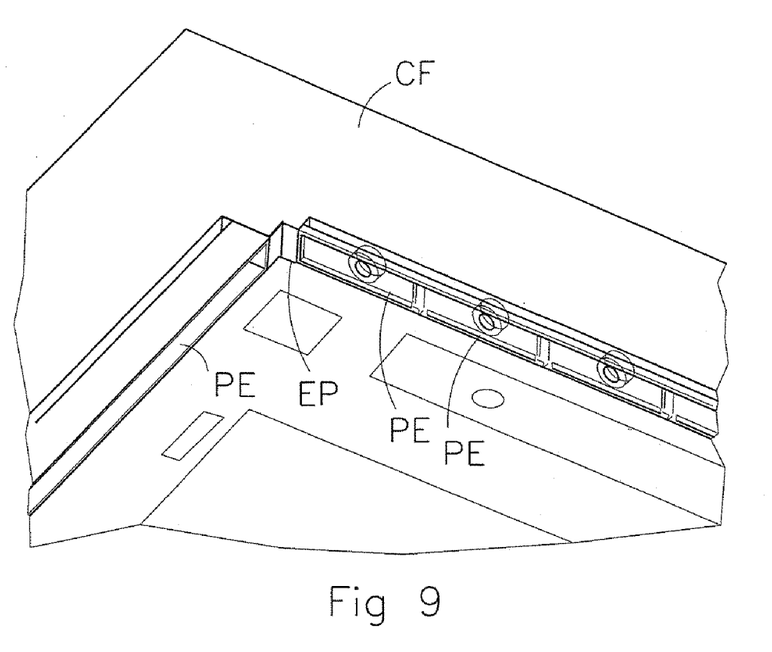
FIG. 9 shows a plurality of the positioning elements of FIG. 8 positioned next to each other.

In FIG. 8, a variant of the positioning element PE is shown which not only is provided with an outflow opening OO at its front side, but also includes small sets of outflow openings OO' at side faces of its head part HP. This has the benefit that a momentum is exerted onto a neighbouring positioning element PE, which momentum helps to keep the positioning elements PE properly aligned (see also FIG. 9). For the same purpose, the first and last positioning element PE of each row is delimited by a suitable corner edge part EP of the clamping frame CF against which their respective outflow openings OO' can likewise exert their momentum.

Figure 10:
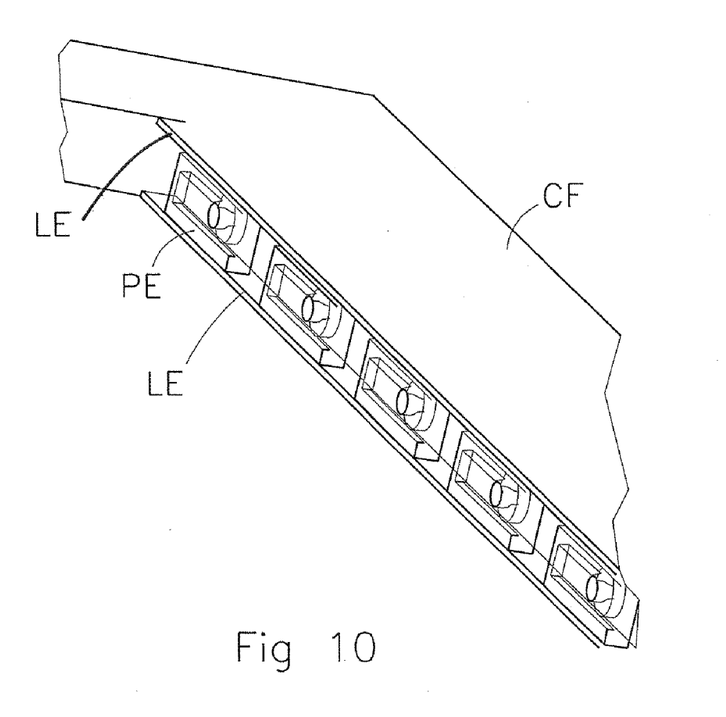
FIG. 10 shows an embodiment in which the positioning elements are delimited between projecting edges.

As an alternative for keeping the positioning elements PE aligned, and stopping them for rotation, FIG. 10 shows an embodiment in which upper and lower projecting limitation edges LE are provided on the clamping frame CF. The positioning elements PE are delimited between the edges LE in such a way that they are not able to rotate around their stem parts SP but still have some freedom to adjust themselves to the respective side face of the clamped mask M.

It is possible to fixedly connect two (of the) positioning elements PE to the frame CF at one side, and to fixedly connect one (of the) positioning element(s) PE to the frame CF at an adjoining rectangular side. In this way, three degrees of freedom (X, Y, Rz) are coupled to the frame with a larger stiffness. Thus, three of the six degrees of freedom are fixed via the frame CF using these positioning elements PE and their intermediate layer of pressurized gas.

Besides the embodiments shown numerous variants are possible. For example it is also possible to provide the one or more outflow openings along only one pair of opposing side faces of the patterning device. Thus, the patterning device is already constrained contactless in one direction of its planar surface. The other pair of opposing side faces of the patterning device can then be delimited in another way using direct contact of a suitable bearing. It is also possible to provide the one or more gas outflow openings along only one side face of the patterning device. In this way also the position of the patterning device in a desired direction can be controlled in a contactless manner, for example by switching the gas pressure on and off and/or by increasing or decreasing the gas pressure of the gas flowing out of these opening(s). This has the effect of being able to exert a bigger or smaller contactless force on that side of the patterning device, and thus control its position.

Instead of driving an entire assembly of a frame together with a set of positioning elements mounted therein, it is also possible to provide a plurality of individually driveable positioning elements. The driver can then be directly coupled to each of the positioning elements individually.

In a further embodiment, is also possible to control the (set of) outflow opening(s) along a respective side face of the patterning device independently from the (sets of) outflow opening(s) at the opposite side face. This makes it possible to keep the patterning device properly centered during an acceleration or deceleration. The outflow opening(s) directed in the acceleration direction may then be temporarily fed with less pressurized gas, whereas the outflow opening(s) directed in the opposite of the acceleration direction may be temporarily fed with more pressurized gas. This makes it able to provide for suitable counter forces upon the patterning device which may compensate for the forces introduced in the patterning device because of its acceleration or deceleration.

It will be appreciated that embodiments of the invention can be used to clamp and/or position other parts of a lithographic apparatus in a contactless manner. For example, in an embodiment of the invention, it is also possible to clamp and/or position an imprint head.

Although specific reference may be made in this text to the use of lithographic apparatus in the manufacture of ICs, it should be understood that the lithographic apparatus described herein may have other applications, such as the manufacture of integrated optical systems, guidance and detection patterns for magnetic domain memories, flat-panel displays, liquid-crystal displays (LCDs), thin-film magnetic heads, etc. The skilled artisan will appreciate that, in the context of such alternative applications, any use of the terms "wafer" or "die" herein may be considered as synonymous with the more general terms "substrate" or "target portion", respectively. The substrate referred to herein may be processed, before or after exposure, in for example a track (a tool that typically applies a layer of resist to a substrate and develops the exposed resist), a metrology tool and/or an inspection tool. Where applicable, the disclosure herein may be applied to such and other substrate processing tools. Further, the substrate may be processed more than once, for example in order to create a multi-layer IC, so that the term substrate used herein may also refer to a substrate that already contains multiple processed layers.

Although specific reference may have been made above to the use of embodiments of the invention in the context of optical lithography, it will be appreciated that the invention may be used in other applications, for example imprint lithography, and where the context allows, is not limited to optical lithography. In imprint lithography a topography in a patterning device defines the pattern created on a substrate. The topography of the patterning device may be pressed into a layer of resist supplied to the substrate whereupon the resist is cured by applying electromagnetic radiation, heat, pressure or a combination thereof. The patterning device is moved out of the resist leaving a pattern in it after the resist is cured.

The terms "radiation" and "beam" used herein encompass all types of electromagnetic radiation, including ultraviolet (UV) radiation (e.g. having a wavelength of or about 365, 248, 193, 157 or 126 nm) and extreme ultra-violet (EUV) radiation (e.g. having a wavelength in the range of 5-20 nm), as well as particle beams, such as ion beams or electron beams.

The term "lens", where the context allows, may refer to any one or combination of various types of optical components, including refractive, reflective, magnetic, electromagnetic and electrostatic optical components.

While specific embodiments of the invention have been described above, it will be appreciated that the invention may be practiced otherwise than as described. For example, the invention may take the form of a computer program containing one or more sequences of machine-readable instructions describing a method as disclosed above, or a data storage medium (e.g. semiconductor memory, magnetic or optical disk) having such a computer program stored therein.

The descriptions above are intended to be illustrative, not limiting. Thus, it will be apparent to one skilled in the art that modifications may be made to the invention as described without departing from the scope of the claims set out below.

What is claimed is:

1. A lithographic apparatus comprising:
   a support constructed to support a patterning device, the patterning device being capable of imparting a radiation beam with a pattern in its cross-section to form a patterned radiation beam, the patterning device having upper and lower planar surfaces connected to each other by side faces;
   a substrate table constructed to hold a substrate;
   a projection system configured to project the patterned radiation beam onto a target portion of the substrate; and
   a position controller configured to control a position of the patterning device in a direction substantially parallel to the planar surfaces of the patterning device by selectively pressing at least one of the side faces of the patterning device, the position controller including a gas pressure supply and one or more outflow openings directed towards the at least one of the side faces of the patterning device, the gas pressure supply and the one or more outflow openings configured to exert pressurized gas on the at least one of the side faces so as to control the position of the patterning device in the direction substantially parallel to the planar surfaces of the patterning device in a contactless manner,
   wherein the position controller includes one or more positioning elements that are arranged such that a gap is present between each positioning element and the patterning device, and wherein the one or more outflow openings open out in the gap, and
   wherein the position controller includes a driver configured to position the one or more positioning elements in the direction substantially parallel to the planar surfaces relative to the patterning device support.

2. The lithographic apparatus of claim 1, wherein the position controller includes at least one pair of opposing outflow openings that are directed towards opposite side faces of the patterning device so as to constrain the patterning device in a contactless manner between the pair of opposing outflow openings with pressurized gas.

3. The lithographic apparatus of claim 2, wherein the position controller includes at least two pairs of opposing outflow openings that are directed towards two pairs of opposite side faces of the patterning device so as to constrain the patterning device in a contactless manner between the two pairs of opposing outflow openings with pressurized gas.

4. The lithographic apparatus of claim 1, wherein the position controller includes a plurality of positioning elements that are each mounted in a common frame which is moveable relative to the patterning device support, and wherein the driver configured to position the plurality of the positioning elements is directly coupled to the frame.

5. The lithographic apparatus of claim 4, wherein each of the positioning elements is flexibly mounted relative to the frame in order to flexibly adjust itself to irregularities in the respective side of the patterning device.

6. The lithographic apparatus of claim 4, wherein the frame extends around the entire circumference of the patterning device.

7. The lithographic apparatus of claim 1, wherein the driver includes a plurality of the positioning elements that are each individually moveable relative to the patterning device support, and wherein the driver configured to position the plurality of the positioning elements is directly coupled to each of the positioning elements individually.

8. The lithographic apparatus of claim 1, further comprising a gas bearing configured to keep the patterning device floating relative to a planar surface of the support.

9. The lithographic apparatus of claim 8, wherein the patterning device is held floating under the planar surface of the support.

10. A lithographic apparatus, comprising:
a support constructed to support a patterning device, the patterning device being capable of imparting a radiation beam with a pattern in its cross-section to form a patterned radiation beam, the patterning device having upper and lower planar surfaces connected to each other by side faces;
a substrate table constructed to hold a substrate;
a projection system configured to project the patterned radiation beam onto a target portion of the substrate; and
a position controller configured to control a position of the patterning device in a direction substantially parallel to the planar surfaces of the patterning device by selectively pressing at least one of the side faces of the patterning device, the position controller including a gas pressure supply and one or more outflow openings directed towards the at least one of the side faces of the patterning device, the gas pressure supply and the one or more outflow openings configured to exert pressurized gas on the at least one of the side faces so as to control the position of the patterning device in the direction substantially parallel to the planar surfaces of the patterning device in a contactless manner,
wherein the position controller includes a frame which extends around an entire circumference of the patterning device and arranged such that a gap is present between the frame and the patterning device, the outflow openings opening out in the gap in opposite positions directed towards opposite side faces of the patterning device so as to constrain the patterning device in a contactless manner between the outflow openings with pressurized gas, the position controller further comprising a driver configured to position the frame with the patterning device constrained therein in the planar direction relative to the patterning device support.

11. A lithographic apparatus comprising:
a projection system arranged to transfer a pattern from a patterning device onto a substrate;
a support constructed to support the patterning device, the patterning device having upper and lower planar surfaces connected to each other by side faces;
a substrate table constructed to hold the substrate; and
a position controller configured to control a position of the patterning device in a direction substantially parallel to the planar surfaces of the patterning device by selectively pressing at least one of the side faces of the patterning device, the position controller including a gas pressure supply and one or more outflow openings directed towards the at least one of the side faces of the patterning device, the gas pressure supply and the one or more outflow openings configured to exert pressurized gas on the at least one of the side faces so as to control the position of the patterning device in the direction substantially parallel to the planar surfaces of the patterning device in a contactless manner,
wherein the position controller includes one or more positioning elements that are arranged such that a gap is present between each positioning element and the patterning device, and wherein the one or more outflow openings open out in the gap, and
wherein the position controller includes a driver configured to position the one or more positioning elements in the direction substantially parallel to the planar surfaces relative to the patterning device support.

12. A device manufacturing method for projecting a patterned beam of radiation onto a substrate, comprising:
supporting a patterning device on a support, the patterning device having upper and lower planar surfaces connected to each other by side faces;
imparting a radiation beam using the patterning device to form a patterned radiation beam;
projecting the patterned radiation beam onto a target portion of the substrate; and
controlling a position of the patterning device in a direction substantially parallel to the planar surfaces, the controlling including
selectively pressing against at least one of the side faces of the patterning device by exerting pressurized gas on the at least one of the side faces of the patterning device using one or more outflow openings and a gas pressure supply so as to control the position of the patterning device in the direction substantially parallel to the planar surfaces of the patterning device in a contactless manner,
the controlling being performed using a position controller that includes one or more positioning elements that are arranged such that a gap is present between each positioning element and the patterning device, and wherein the one or more outflow openings open out in the gap, and
wherein the position controller includes a driver configured to position the one or more positioning elements in the direction substantially parallel to the planar surfaces relative to the support.

13. The method of claim 12, wherein the patterning device is constrained in a contactless manner between pressurized gas exerted out of at least one pair of opposing outflow openings which are directed towards opposite side faces of the patterning device.

14. The method of claim 13, wherein the patterning device is constrained in a contactless manner between pressurized gas exerted out of at least two pairs of opposing outflow openings which are directed towards two pairs of opposite side faces of the patterning device.

* * * * *